United States Patent
Wall et al.

[19]

[11] Patent Number: 5,818,873
[45] Date of Patent: Oct. 6, 1998

[54] SINGLE CLOCK CYCLE DATA COMPRESSOR/DECOMPRESSOR WITH A STRING REVERSAL MECHANISM

[75] Inventors: Robert Lyle Wall, Bozeman, Mont.; Kel D. Winters, Moscow, Id.

[73] Assignee: Advanced Hardware Architectures, Inc., Pullman, Wash.

[21] Appl. No.: 924,293

[22] Filed: Aug. 3, 1992

[51] Int. Cl.[6] .................................................. H04B 1/66
[52] U.S. Cl. .......................... 375/240; 375/377; 360/49; 365/49; 341/106
[58] Field of Search .................................. 375/122, 240, 375/241, 377; 341/51, 95, 61, 52, 55, 94, 87, 106; 358/133; 365/49; 360/40, 49; 348/384

[56] References Cited

U.S. PATENT DOCUMENTS

| | | | |
|---|---|---|---|
| 3,714,439 | 1/1973 | Williams et al. | 365/390 |
| 4,558,302 | 12/1985 | Welch | 341/51 |
| 5,142,676 | 8/1992 | Fried et al. | 395/425 |
| 5,214,626 | 5/1993 | Satoh et al. | 369/32 |
| 5,485,526 | 1/1996 | Tobin | 382/232 |

OTHER PUBLICATIONS

T. Welch, "A Technique for High–Performance Data Compression," IEEE Computer, Jun., 1984.

J. Ziv and A. Lempel, "Compression of Individual Sequences via Variable–Rate Coding," IEEE Trans. on Inf. Thy., vol. IT–24, No. 5, Sep., 1978.

*Primary Examiner*—Don N. Vo
*Attorney, Agent, or Firm*—Haverstock & Owens LLP

[57] ABSTRACT

A single clock cycle adaptive data compressor/decompressor with a string reversal mechanism is described which can perform data compression and decompression at the rate of one uncompressed symbol per clock cycle. The LZW data compression algorithm has been improved for use in this data compressor. The compressor builds a string table as the data is received. Each string within the table is made up of the address within the table of the longest previously seen matching string and the one character that makes this string different. This data compressor/decompressor utilizes a content addressable memory to store the string table. This content addressable memory allows the compressor to store the current symbol string in a table while that same string table is simultaneously searched for the current string. During decompression the characters within a symbol string are output in reverse of the order in which they were input. In order for the data to be restored to its original format the characters within a string must be reversed before they are output. Two dual-ported random-access memories are used as circular queues to perform this string reversal. These dual-ported random-access memories have the capability to output the characters within a string from the string reversal mechanism in the order that they were input. The first dual-ported random access memory is used to store the strings of symbols to be reversed and the second dual-ported random access memory is used to store the addresses of the first and last symbol of each string that is stored in the first dual-ported random-access memory.

49 Claims, 3 Drawing Sheets

SINGLE CLOCK CYCLE DATA COMPRESSOR/DECOMPRESSOR WITH A STRING REVERSAL MECHANISM

FIELD OF THE INVENTION

This invention relates to the field of data compression and decompression. More particularly, this invention relates to data compressors which compress data using an adaptive scheme with a string table, such that the compression will depend on the content of the data to be compressed.

BACKGROUND OF THE INVENTION

Data compression is a technique that can be used when either storing or transmitting a block of data which contains some redundancy. By compressing such a block of data its effective size can be significantly reduced without reducing the amount of information that is carried by the particular data block. Data compression increases the density of information that is to be stored or communicated by reducing the amount of memory needed to store the block of data or the transmission time necessary to transmit such a block of data. There are three significant characteristics that are used to evaluate data compressors; how efficient the compressor is, how fast the compressor is, and can the compressor fully reproduce the block of data without introducing any error.

The efficiency of a data compressor is measured in a quantity called a compression ratio which is calculated by dividing the number of uncompressed characters by the number of compressed characters. The higher the compression ratio the greater the density of the compressed data. A compression ratio of 2 means that the number of characters after compression is half of the number of characters before compression.

Another important characteristic of a data compressor is how closely the output from the decompressor matches the original input. Compression techniques can be divided into two subdivisions, lossless and lossy. Lossless methods allow the exact reconstruction of the original data from the compressed data. Lossless methods are most appropriate for text compression applications or other applications where it is essential that the data be fully restored to its original condition. Lossy methods allow for some error to occur during compression and decompression. These types of methods are used where a good approximation is sufficient, such as on digitally sampled analog data.

The speed of a data compressor is also a very important characteristic to be considered. Devices that interact with a computer must be fast enough to allow the computer to function efficiently without creating a bottleneck in the system. In order to be beneficial to the system a compressor must interface with the computer without slowing down its operation.

There are numerous techniques used to compress data. One of the most popular methods, Huffman coding, translates fixed-size pieces of input data into variable-length symbols. Frequently used symbols are represented by shorter codes and less commonly used symbols are represented by longer codes. To use this technique the frequency of each symbol's occurrence in the data must be known ahead of compression. To determine the frequency of each symbol, the block of data must be examined once before it is compressed, unless the characteristics of the block are known in advance. Then after the frequency of each symbol is determined, the codes for each symbol are generated and the data is compressed, with each code stored representing its particular symbol.

Another common method of data compression is adaptive compression or as it is sometimes referred to, dictionary based compression. Adaptive compression begins with an empty table of symbol strings and builds the table as the data is compressed so that the contents of the string table will reflect the characteristics of the particular data block. Using this method, a compression ratio above 1 can be achieved if the number of bits required to represent a symbol string is less than the average length of repeated symbol strings.

This type of adaptive compression scheme was introduced by Jacob Ziv and Abraham Lempel in an article entitled "Compression of Individual Sequences via Variable Rate Coding", IEEE Transactions on Information Theory, Vol. 24, No. 5, pages 530–536 (September 1978). This method constructs a table or dictionary of symbol strings from the data as it is input to the compressor. Then the next time that a specific string is encountered its corresponding dictionary index will be transmitted instead of the symbol string. This compression scheme is referred to as LZ78 and it requires only one pass over the data in order to perform compression.

In 1984 Terry Welch proposed a variation on the LZ78 procedure in "A Technique For High-Performance Data Compression", IEEE Computer, Vol. 17, No. 6, pages 8–19 (June 1984). This data compression scheme is referred to as the LZW algorithm and also requires only one pass over the data. It is organized around a table, made up of strings of characters, where each string is unique. Each string is referenced by a fixed length code which represents the longest matching string seen thus far in the previous input plus the one byte that makes this string different from prior strings. Each string is stored in the table at the next available address as determined at the time the string is input.

As the data is input into the compressor, the compressor parses the symbols into strings where as stated above, each string consists of the longest matching string seen thus far in the previous input plus the one symbol that makes it different from prior strings. These strings are then added to the table and coded as ωK, where ω is the index of the previous string, or prefix, and K is the one symbol that makes this string different from prior strings. K is called the extension character of the prefix string ω and is represented by its normal binary representation. For every string that is stored in the table its prefix, ω, is also stored in the table. The prefix, ω, is represented by the binary representation of its address within the table. The number of bits used to represent ω will depend on the size of the table to be used. For example, if the table is to be capable of holding up to 4096 entries, then twelve bits are needed to represent ω. The string table can be initialized to contain all single-symbol strings in its early addresses. This initialization will facilitate a faster compression of data because the string table will start building strings that are at least two characters long and will not have to store the single-symbol strings as they are input.

The algorithm representing this technique as written by Welch is:

---

Initialize table to contain single-character strings.
Read first input character → prefix string ω
Step: Read next input character K
    If no such K(input exhausted):
        code(ω) → output; EXIT
    If ωK exists in string table:
        ωK → ω; repeat Step
    else ωK not in string table:
        code(ω) → output;
        ωK → string table;
        K → ω; repeat Step.

---

This algorithm builds a string one character at a time out of the data as it is input. If a string, ωK, already exists in the string table, then its location is placed in ω and the next character, K, is added to make up a new string, ωK. If this new string, ωK, already exists in the string table, then its location is placed in ω and the next character, K, is added to make up a new string, ωK. This process continues until a string is not found in the string table. When a string is not found in the string table, ω is output, ωK is stored in the string table at the next available address, and K is then stored in ω, so that the next string ωK will begin with the extension character of the last string stored.

A simple example of how this algorithm works can be illustrated by compressing the data flow of "abcbcab". This example is illustrated in Table 1 where the input, output codes, and the string table are shown. FIG. 1 shows a trie representation of the string table that is constructed from this example. There are only three different characters that are used in this example, so the string table can be initialized so that "a" is stored in location "1", "b" is stored in location "2", and "c" is stored in location "3". The location of the first character of the input data, "a", is read and place in ω. The next character, "b", is read and its binary representation is placed in K so that taken together "a" and "b" now represent a string ωK which equals "1b". The table is now searched for the string "1b" and because this string does not yet exist in the string table it is stored in the table at the next available address, "4". The prefix ω is output from the compressor to be either stored as part of the compressed data in the memory or transmitted to another computer.

The address of the character stored in K, presently "b", is now stored in ω, which means that ω now is equal to "2". The next character, "c", is now stored in K, so that ωK now equals "2c". The table is now searched for this string "2c" which does not yet exist and because this string does not yet exist it is stored at the next available location, "5". The prefix, "2", is then output to be stored or transmitted as part of the compressed data. Next, the address of the character stored in K, presently "c", is stored in ω, so that ω will equal "3". The next character, "b", is read and stored in K, and ωK now is equal to "3b". Since this string does not yet exist it is stored at the next available address, "6". The prefix, "3", is output, the address of the character stored in K is stored in ω, and the next character, "c", is stored in K, so that ωK now equals "2c". The string table is searched for this string and it is found at location "5", this location is then stored in ω and the next character, "a", is read and stored in K which means that ωK now equals "5a". The table is then searched for this string, and since it does not yet exist in the string table, it is stored at the next available location which is "7". The prefix, "5", is then output, the location of the character stored in K is stored in ω, and the next character "b", is stored in K, so that ωK now equals "1b". The table is then searched for this string, it is found at location 4 and this location is stored in ω. There is no next character in the data flow, so ω is output and the compression is finished.

TABLE 1

Compression example showing seven-bit input stream compressed to five output codes with accompanying string table.

| Input Symbols: | a | b | c | b | c | a | b |
|---|---|---|---|---|---|---|---|
| Output Codes: | 1 | 2 | 3 |  | 5 |  | 4 |
| String Table: |  | Location |  |  | Code Value |  |  |
|  |  | 1 |  |  | 0a |  |  |
|  |  | 2 |  |  | 0b |  |  |
|  |  | 3 |  |  | 0c |  |  |
|  |  | 4 |  |  | 1b |  |  |
|  |  | 5 |  |  | 2c |  |  |
|  |  | 6 |  |  | 3b |  |  |
|  |  | 7 |  |  | 5a |  |  |

The above example took a data flow of seven characters, "abcbcab", and compressed it into five output characters, "12354." Accompanied by the string table the five output characters fully represent the seven input characters. As can be seen by this example, the compression ratio will improve as the data block is increased. The compression ratio for the first three characters is 1 while the compression ratio for all seven characters is 7/5 or 1.4. This ratio will improve even more as the data block is extended to more characters.

Decompression, using the LZW algorithm of a group of output codes can be achieved as long as they are accompanied by their string table. During decompression the decompressor takes the codes as they were output from the compressor and translates each one into its prefix and extension character. The extension character is output and the string stored at the location represented by the prefix is separated into its prefix and extension character. This process continues until the prefix contains a single symbol string. When this happens the symbol is output and the next code is read from the memory, and it is separated into its prefix and extension character. The extension character is then output and the string stored at the location represented by the prefix is separated into its prefix and extension character. This process is continued until there are no codes left to be decompressed.

The decompressor uses the same string table as built by the compressor to look up the strings. As the codes are translated the decompressor builds its own string table which is identical to the compressor's string table. An update is made to the string table for each new code that is received. The decompression algorithm as written by Welch is:

| Decompression: | Read first input code → CODE → OLDcode; with CODE = code(K), K → output; |
|---|---|
| Next Code: | Read next input code → CODE → INcode; If no new code; EXIT, else: |
| Next Symbol: | If CODE = code(ωK): K → output; code(ω) → CODE; Repeat Next Symbol Else if CODE = code(K): K → output; OLDcode; K → string table; INcode → OLDcode; Repeat Next Code. |

There are two problems with this algorithm as written. The first problem being that the characters within each string, when decompressed are output in reverse of the order in which they were input originally to the compressor. Second, there is an abnormal case which may cause an error during decompression. This error may occur when a second string is only a one symbol extension of the string before it and this one symbol is identical to the first symbol of the second string. This condition occurs because the decompressor is creating a string table identical to the compressor's, but it is one step behind the compressor, so that when the decompressor receives this code, the code will not yet be in the string table.

For an example of how this decompression algorithm works, the output codes, as generated above, will be decompressed to restore them to their original form. This decompression example is illustrated in Table 2 which shows the codes input and the data output in the exact order as it would be output from the decompressor. The first code, "1", is read and its extension character "a", is output. The next code, "2", is read and since it also only consists of one character "b", this character is output. The third code, "3", is read and "c" is output. The next code, "5", is read and translated into its prefix, "2", and its extension character, "c". The extension character, "c", is output and the string located at the value represented by the prefix is translated into its prefix and its extension character. This string, "2", only consists of a single character, "b", which is output. The last code, "4", is read and translated into its prefix, "1", and its extension character, "b". The extension character, "b", is output and the string located at the value represented by the prefix is translated into its prefix and extension character, but since this code, "1", only consists of a single character, "a", that character is output.

The decompression of the codes, as illustrated in Table 2, resulted in the output of "abccbba". This output is not the same as the original data that was input to the compressor. The reason that this data was not restored to its exact input format is because within each multiple character string the data has been reversed as it was decompressed. To restore each string of characters to its correct order, each string must be reversed as it is output from the decompressor. The first three strings are all single-symbol strings so they do not need to be reversed. The next string was output as "cb." Reversed, this string is "bc" which is the correct order of the string as it was input. The last string was output as "ba." Reversed, this string is "ab" which matches the order of the string as it was input. After reversing the last two strings the output will be "abcbcab" which is exactly the same as the data flow that was input to the compressor.

TABLE 2

Decompression example showing decompression of the data that was compressed in Table 1.

| Code Input to Decompressor: | 1 | 2 | 3 | 5 | 4 |
|---|---|---|---|---|---|
| Output: | a | b | c | $c_b$ | $b_a$ |

This method and an apparatus implementing the LZW algorithm are presented by Mr. Welch in U.S. Pat. No. 4,558,302. This device utilizes a random access memory for storage and a limited search hashing procedure to search through the string table and enter extended strings in the random access memory. The LZW algorithm as presented above is used in this invention to compress and decompress the data. This device uses a last-in first-out (LIFO) stack to reverse the order of the characters within a string as they are output from the decompressor. This LIFO stack will push the string onto the stack one character at a time and then once the entire string is pushed the characters are then popped off of the stack, one at a time, in reverse of the order in which they were pushed. The decompressor must wait before pushing the next string onto the stack while the current string is popped off of the stack.

What is needed is a data compressor that can search the string table for a string and simultaneously write a string to the table. By simultaneously searching for and writing a string to the string table, the time needed for compression can be reduced so that one character can be input every clock cycle. A string reversal mechanism is also needed which has the capability to take the data output from the decompressor and push one string onto a stack as another string is popped off of the stack, without utilizing excessive memory space.

SUMMARY OF THE INVENTION

This single clock cycle data compressor/decompressor with a string reversal mechanism can compress data adaptively, decompress previously compressed data, and reverse the characters within a string of data that has been decompressed in order to restore the data to its original format. The compressor can compress data at the rate of 1 character per clock cycle. A content addressable memory is used to facilitate faster compression. The content addressable memory has the ability to perform a write and a search function during the same clock cycle. Strings of characters are encoded and stored in a string table. The input data is then matched to strings already stored in the string table. The string table is built as the data is input and the contents of the string table is completely dependent on the data that is to be compressed. Each string stored within the string table represents a multiple number of characters and is stored as the location within the string table of the longest matching string seen in the previous input and the one character that makes this string different than all the rest of the strings stored in the string table.

During decompression, the codes for the strings are output to the decompressor and the one character that makes each string different is separated and output. The extension character stored at the address of the longest matching string seen thus far is then separated and output, until all of the characters in the string have been output. During decompression the characters within each string are output in reverse of the order in which they were originally input. The string reversal mechanism is used to reverse the order of the characters within a string and output them in their correct order.

The string reversal mechanism has the capability to output one string in reverse order as it is inputting another string from the decompressor thus speeding up decompression. Two dual-ported random-access memories are used in the string reversal mechanism each have the capability of inputting and outputting at the same time. The first dual-ported random-access memory is used to store the strings to be reversed, one character at a time. The second dual-ported random-access memory is used to store the beginning and ending addresses of each string that is stored in the first dual-ported random-access memory.

This single clock cycle data compressor/decompressor with a string reversal mechanism can reduce the size of a block of data to be stored or transmitted without reducing the amount of information stored in the block of data. The decompressor and the string reversal mechanism then can convert the compressed data that was stored or transmitted back into its original format.

DETAILED DESCRIPTION OF THE PREFERRED EMBODIMENT

Figure 1:
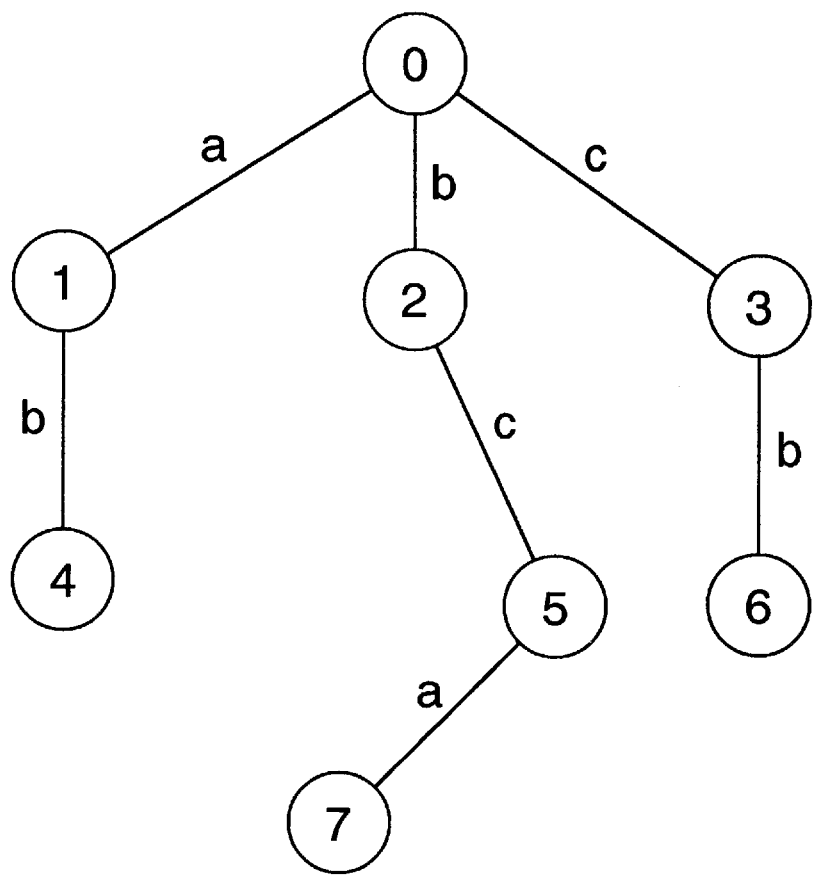
FIG. 1 is a trie representation of an LZW string table using the data flow "abcbcab."
Figure 2:
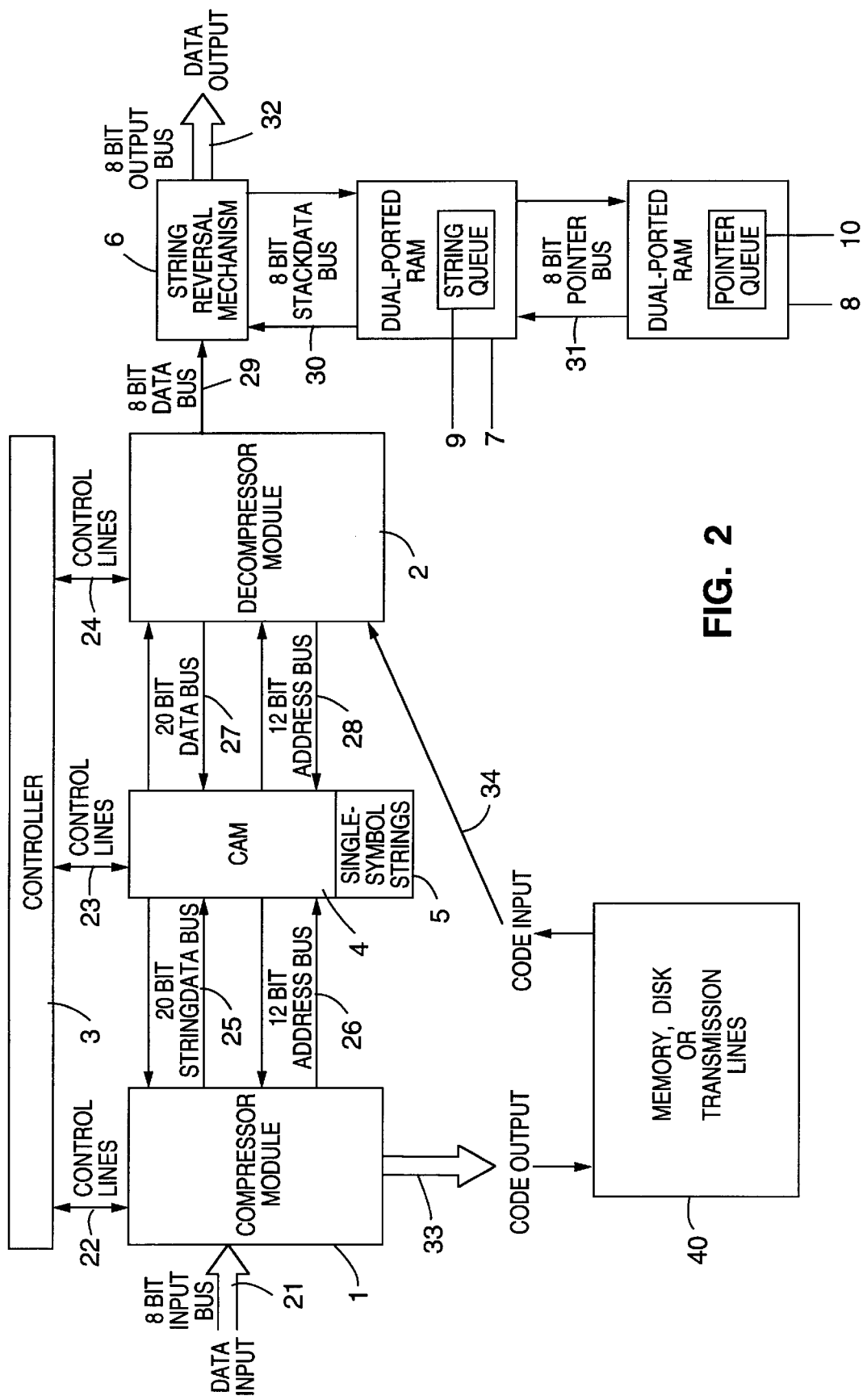
FIG. 2 is a block diagram of the single clock cycle data compressor/decompressor with a string reversal mechanism.
Figure 3:
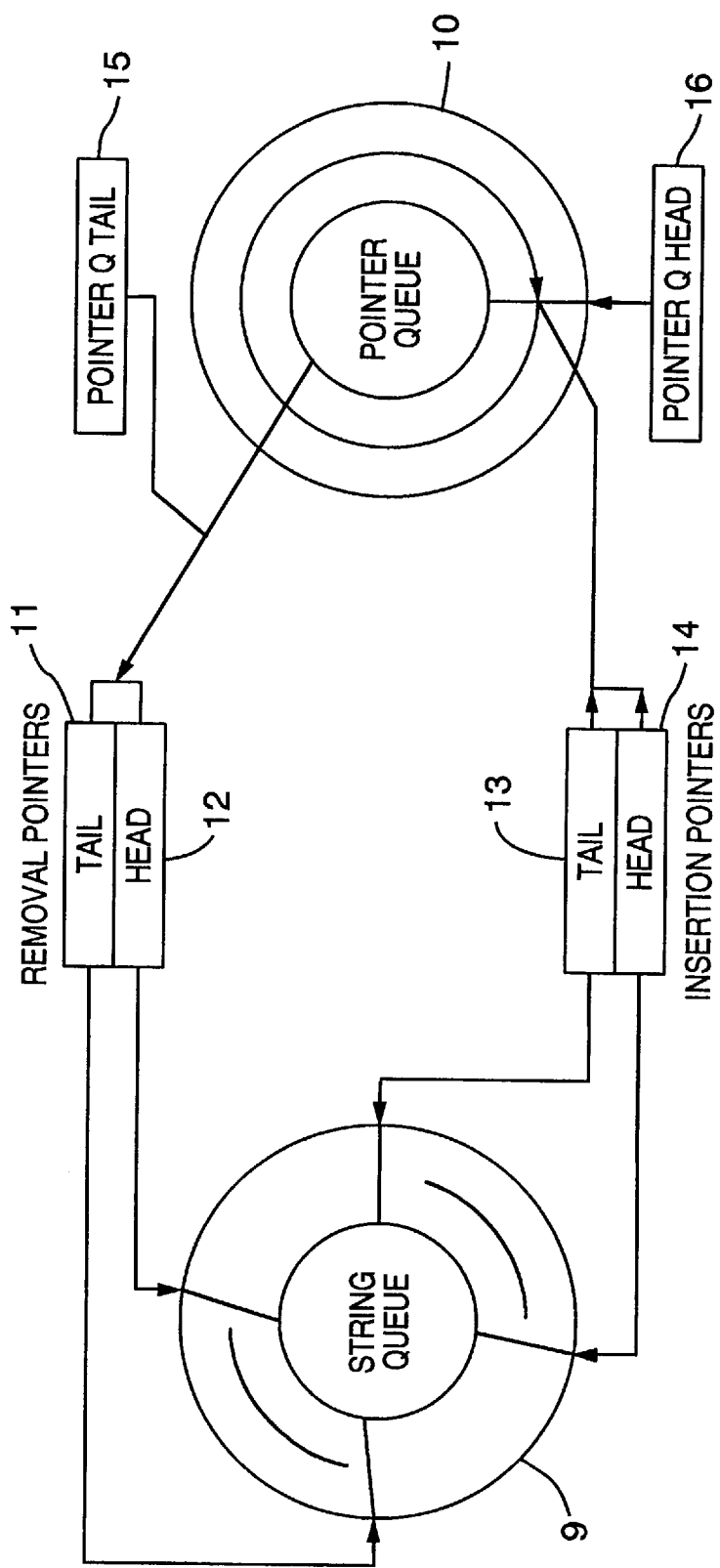
FIG. 3 is a block diagram of the string reversal mechanism.

The single clock cycle data compressor/decompressor with a string reversal mechanism of the preferred embodiment, as shown in FIG. 2, can compress or decompress data at the rate of one uncompressed symbol per clock cycle. The system utilizes a content addressable memory 4 in which data can be read from, written to, or searched for. The LZW algorithm has been improved for use in this system to facilitate faster and more efficient data compression. A string reversal mechanism 6 is used to reverse the order of characters within a string as output from the decompressor 2. This string reversal mechanism allows the data to be restored to its original format upon output from the system. The system performs lossless data compression and can be utilized for all types of applications including, but not limited to, data storage and data transmission.

As illustrated in FIG. 2 the compressor module 1 is connected to an eight-bit input bus 21 for inputting a byte of data at a time to be compressed. The compressor module is also coupled to a controller 3 by the control lines 22 which control the compression of data. The compressor module 1 is coupled to a content addressable memory 4 by a bi-directional twenty bit stringdata bus 25 and a bi-directional twelve bit address bus 26 for storing and retrieving strings of compressed data. The compressor module can also be coupled at its output 33 to a memory, disk or another computer by transmission lines 40 for sending the compressed data to a remote location.

The memory, disk or transmission lines 40 can also transmit data to the decompressor module 2 to be decompressed. The decompressor module is coupled to the controller 3 by the control lines 24 which control the decompression of data. The decompressor module is coupled to the content addressable memory 4 by a bi-directional twenty bit data bus 27 and a bi-directional twelve bit address bus 28 for storing and retrieving compressed strings of data. The decompressor module 2 is also coupled to the string reversal mechanism 6 by an eight bit data bus 29 for transmitting bytes of data that have been decompressed but are parts of a string that are to be reversed. The string reversal mechanism 6 is coupled to a first dual-ported random-access memory 7 by a bi-directional eight bit stackdata bus 30. The first dual-ported random-access memory contains the string queue 9 for storing the strings of bytes to be reversed. The first dual-ported random-access memory 7 is coupled to a second dual-ported random-access memory 8 by a bi-directional eight bit pointer bus 31. The second dual-ported random-access memory 8 contains the pointer queue 10 which holds the beginning and ending addresses of strings that are contained in the string queue 9. The string reversal mechanism 6 is also coupled to an eight bit output bus 32 for outputting the bytes that have been decompressed and reversed.

The content addressable memory 4 is coupled to the controller 3 by control lines 23 for sending instructions during compression and decompression. The content addressable memory is used by both the compressor module 1 and the decompressor module 2 to store the string table that is needed for both compression and decompression of data. All of the characters in the ASCII character set can be hard-wired 5 in the content addressable memory as single-symbol strings for speed and efficiency during compression. In the preferred embodiment, the coded representations in the single character strings are equal to the ASCII character set. Thus, no memory look up is needed for decompression. For compression, a step is saved in the algorithm and 256 memory locations are saved.

Bytes of data to be compressed are input to the compressor module 1 on an eight bit input bus 21 from a computer. The compressor parses the bytes of data to be compressed into strings. Each string is made up of the address of another string and an extension character which makes this string different from the other string. The strings are stored in the content addressable memory 4 in a string table. Once the bytes of data are compressed into strings the representation for each string is then output 33 either to be stored in the computer's memory, to be stored on a disk or to be transmitted to another computer.

Data to be decompressed can be sent to the decompressor module 2 from the computer's memory, from a disk or from another computer. The data is sent as twenty bit representations of strings, with eight bits representing an extension character and twelve bits representing the address of the remainder of the string. The decompressor 2 then parses each extension character from the string, sends this character to the string reversal mechanism 6 and goes to the address of the remainder of the string to retrieve the next extension character and send it to the string reversal mechanism. When all the characters of a string have been sent to the string reversal mechanism 6 this mechanism then outputs the characters in their original order to the computer.

The single clock cycle data compressor/decompressor with a string reversal mechanism as designed, is illustrated in FIG. 2. The data to be compressed is input into the compressor module 1 via an eight bit bus 21. The compressor is instructed by the controller 3 via a bi-directional control bus 22, and together they implement the compression algorithm. The compressor and controller both interface with the content addressable memory (CAM) 4, where the string table is stored. The compressor is coupled to the CAM by a twenty-bit data bus 25 and a twelve-bit address bus 26. The first 256 entries in the string table are used to represent the ASCII codes for individual characters. The logic representing these 256 ASCII codes 5 is hard-wired into the CAM. The compressed data is output 33 from the compressor to another source 40 for storage in the memory of a computer or on a disk or for transmission to another computer.

Data to be decompressed is input 34 from a source 40 such as a disk or another computer into the decompressor module 2. The decompressor is also instructed by the controller 3 and together they implement the decompression algorithm. The decompressor is coupled to the CAM 4 by a twenty-bit data bus 27 and a twelve-bit address bus 28. As illustrated in FIG. 2, the controller 3 is shown as a separate block of control logic and is coupled to the compressor module 1 by the control lines 22, to the CAM 4 by the control lines 23 and to the decompressor 2 by the control lines 24. It will be apparent to one of ordinary skill in the art that the compressor 1 and the decompressor 2 could also comprise the control logic of the controller 3. If the control logic is contained within the compressor module 1 and the decompressor module 2, then a match line will couple the CAM 4 to the compressor module 1.

The decompressor 2 outputs the decompressed characters to a string reversal mechanism 6 by an eight-bit data bus 29. The string reversal mechanism uses two dual-port random-access memories 7,8 to reverse the order of the characters within each string before they are output by the eight-bit output bus 32. The first dual-port random-access memory 7, receives data from the string reversal mechanism by the eight-bit Stackdata bus 30, and is used to store the strings, one byte at a time, in the order that they are received from the decompressor. These strings are stored within the first dual-ported random-access memory in the string queue 9. The second dual-port random-access memory 8, is connected to the first dual-port random-access memory by the eight-bit pointer bus 31 and is used to store the beginning and ending address of each string that is currently stored in the first dual-port random-access memory. These addresses are stored within the second dual-ported random-access memory in the pointer queue 10.

The present invention utilizes a DCLZ algorithm which is based on the LZW algorithm, as explained above, but includes additional features that improve the compression efficiency and the compressor's handling of input data blocks. Variable code lengths, a limited string table, the size of the strings also limited and a compression ratio monitoring function are among the improvements added to the compression algorithm.

The present invention imposes a limit on the number of entries that can be stored in the string table to 4088. Because the string table is limited to 4088 entries the largest codeword that is needed is twelve bits. In the present invention codeword lengths for the prefix of a string will vary from nine to twelve bits depending on the size of the string table for a particular data block. Note that the DCLZ Algorithm limits the string table to 4088 while the LZW Algorithm limits the string table to 4096.

The DCLZ algorithm limits the length of strings to 128 bytes or less. When a string of 128 bytes is accumulated, its prefix, or ω value is output and the next input byte is used to reinitialize ω and begin a new string. This limitation of the string size also serves to enhance the performance of the decompressor and the string reversal mechanism.

The decompression algorithm has also been improved for use in the present invention. As noted above the LZW decompression algorithm had two basic problems as it was written; one, the symbols are output in reverse of the order that they were input and two, there is a special input case in which the compressor will output a code which the decompressor will not yet have in its string table.

When using the LZW algorithm the abnormal input condition occurs because, the decompressor is one step behind the compressor in the creation of its string table. The problem arises when a string of the form KωKωKL is encountered, where K and L are single input symbols, ω is a string, and Kω is already in the string table. When the compressor encounters the second K, it will send the code for Kω, add the string KωK to the string table and start over with the string K. The compressor will then parse the input until it comes to L, at which time it will send the code for KωK, which was the last string added to the table. When the decompressor receives this code, it will not yet be in the string table.

The only strings which cause the above problem are of the form discussed, where the second string is just a one-symbol extension of the first string, and that extension symbol is identical to the first symbol of the string. To correct this problem the algorithm has been written so that when the decompressor encounters a code that is not yet in the string table, it knows that the last symbol must be the same as the first symbol of the previous string, and the remainder of the string is identical to the previous string. Thus, if the first symbol of each string produced is stored, and the previous string is available in the Oldcode register, the input code can be replaced by this combination and decompressed. The algorithm as modified is:

```
Initialize string table to contain all single-symbol strings
OldCode ← first input code
FirstSymbol ← K ← StringTable [Oldcode].LastSymbol
Output K
While more input data available
    Incode ← Code ← next input code
    If Code not in string table
        Push FirstSymbol on stack
        Code ← OldCode
    End if
    While    StringTable [Code].Prefix ≠ NULL
             K ← StringTable [Code].LastSymbol
             Output K
             Code ← StringTable [Code].Prefix
    End While
```

```
    FirstSymbol ← K ← StringTable [Code].LastSymbol
    Output K
    Add string OldCode + K to string table
    OldCode ← InCode
End While
```

To facilitate greater efficiency and faster compression of the data, a content addressable memory (CAM) 4 is used in the present invention to store the string table during compression. Content addressable memory cells perform typical random access memory read and write operations, and they also have the additional capacity to determine if the data being searched for matches the data that is stored in the cell. If there is matching data stored in the memory then a signal is placed on a match line 23 to notify the controller. The content addressable memory may be static or dynamic, if the manufacturing process allows.

This content addressable memory 4 is used in the present invention during both compression and decompression. During compression the CAM is used to store the string table and to perform searches of that string table to determine if a given string is already stored in the table. The current symbol string is always written to the symbol table as a search is conducted for the same string in the symbol table. This combines two memory accesses into one and thus speeds up compression of the data because the compressor can perform both of these operations simultaneously, instead of waiting until the search is complete before the data is written to the memory.

During data compression the content addressable memory 4 receives information from the compressor 1 on the twenty-bit data bus 25 and the twelve-bit address bus 26. The twenty-bit data bus carries the information for each string with the first twelve bits reserved for the prefix, ω, of the string, and the last eight bits reserved for the extension character, K, of the string. The twelve-bit address bus carries the next available address in the string table that a string code can be written to.

The content addressable memory 4 is searched for the presence of the string on the twenty-bit data bus 25 simultaneously as that same string is written to the address indicated by the twelve-bit address bus 26. If the string is found in the CAM, the Match line will signal that a match for the string has been found and the CAM address where the string was found is output to the controller 3. Because the string was found and already exists in the string table it is not necessary to store it again in the string table. Therefore, the Controller 3 does not increment the address indicated by the twelve-bit address bus, so that the address location just written to will be overwritten on the next clock cycle. If the string is not found in the CAM the Match line will signal that a match for the string has not been found. In this case it is necessary to store this string in the string table. Since the string has already been written while the CAM was searched, all that is necessary in order to save the string in the string table is to increment the address indicated by the twelve-bit address bus. This insures that on the next clock cycle the CAM will not overwrite the string just added to the dictionary.

The performance of the proposed compressor may be further enhanced by removing the increment address function and pipelining the Code and Match outputs by one clock cycle so that they will always represent the result of the search conducted on the previous clock cycle. In this enhanced version two address busses are output from the compressor module 1, Address and NextAddress, where NextAddress is always one greater than the value of Address. In this enhanced version, logic is added to the CAM 4, in order for the effective write address to be selected from either Address or NextAddress based on the results of the previous search as indicated by the pipelined Match signal.

If the string is found in the string table, the Match line is at a high potential, indicating that the previous search did find the string in the string table, the string is written to the location represented by Address in the content addressable memory, overwriting the previous contents of that location, and Address and NextAddress are not incremented. If the string is not found in the string table, the Match line remains at a low potential, indicating that the previous search did not find the string in the string table and the string is then written to NextAddress. The CAM location indicated by Address, which was written on the previous clock cycle, is left undisturbed and both Address and NextAddress are then incremented.

In the present invention the string table is limited to 4088 separate locations of which the first 256 will each represent a single-byte character. Naturally, these limits can be increased. These 256 characters are the characters that are included in the ASCII character set and their address will represent the value of their ASCII code. These characters can either be written into their respective addresses in the content addressable memory 4 every time that it is initialized or they can be hard-wired into the CAM so that they will always be present. It is also possible that the first 256 address locations 5 and codes into the CAM are hard-wired. Each string in locations 0 through 255 will consist of a single byte having the same value as its address, followed by the null prefix code, "0000." The ASCII code for "a" is "0110 0001", so the string that will be stored at the address represented by that code will be the null prefix followed by the ASCII code for "a" results in "0000 0110 0001." These first 256 table entries will never be written, only read and searched, so rather than create content addressable memory or even read only memory words to hold them, simple combinational logic can be added to simulate the CAM operation for these locations.

A dynamic content addressable memory (DCAM) 4 could be used in the present invention and thus will require periodic refreshing. The control logic should halt normal operations periodically and generate a refresh cycle. This refresh cycle will consist of placing the address of a row at a time on the twelve-bit address bus 26 and asserting the Refresh signal; during this cycle, the Read, Write, and Search signals should not be asserted, and the value on the InputData bus will be ignored. The DCAM will refresh the contents of every bit in that row simultaneously. In addition to regenerating cell contents during the refresh cycle, the capability will also be provided to refresh an entire row whenever a word in that row is written to the DCAM.

When the codes representing a string are output from the compressor module 1 during compression, they are sent to a device 40 such as a disk, if they are to be stored, or another computer if they are to be transmitted. During decompression the codes are input from a device 40 such as a disk or another computer into the decompressor module 2. The decompressor then decodes the strings one byte at a time by separating each string into its extension character and its prefix. The extension character is then output to the string reversal mechanism 6 and the string that is stored at the address represented by the prefix is separated into its prefix and extension character. This process continues until a single character string is reached having a code representing its ASCII value followed by the null prefix. When the null prefix is reached, the last character of the string is output to the string reversal mechanism and a new code is input to the decompressor module. The order that the characters are output from the decompressor to the string reversal mechanism is in reverse of the order that the characters were input to the compressor such that the last character input of each string is the first character output from the string reversal mechanism.

The string reversal mechanism 6 has the capability to take the characters within each string and reverse them so that as they are output they will appear in the order that they were input to the compressor. A simple stack could be used to reverse the output strings as was done by Welch, but once a string has been pushed onto the stack, the decompressor 2 must wait until that string is completely popped off the stack before it can begin pushing the next string. A dual-ended stack will help this somewhat by allowing a string to be pushed onto one end of the stack as a second string is being popped off of the other end of the stack. A stack of this sort that is large enough to hold a maximum-length string can be used to process two strings concurrently, if it maintains two stack heads and has the capability of performing simultaneous pushes and pops. This dual-ended stack still does not completely solve the problem efficiently. If a very long string is pushed onto the stack followed by a single-byte string, the decompressor must still wait for the first string to be completely popped off before continuing.

Multiple stacks could be used and if there are enough of them available, the decompressor 2 would never need to wait for space to push a string. The output strings to be reversed in the present invention have been limited to a length of no more than 128 characters, so the number of stacks that would be required can be readily determined. The most demanding case that the decompressor could produce would be a string of maximum length followed by a succession of single-byte strings. The first string has been limited to 128 bytes, so by the time the 128th single-byte string has been pushed, the first string will have been completely popped off of the stack and that stack will be available for another string. Because this is the most demanding case that the decompressor could produce, the maximum number of stacks required is 129.

To allow the decompressor 2 to operate efficiently without ever having to wait for a stack to be popped off before another can be pushed on, 129 stacks of the maximum length would have to be used. To implement 129 stacks that are capable of holding 128 bytes each would require 16,512 bytes of memory most of which would be unused at any given time. This method is not desirable because of the inordinate amount of memory that would be required. The preferred method is to implement a circular stack which would allow a string to be popped off as another string was being pushed onto the stack and is capable of holding multiple strings. By reducing the number of stacks to 64, area on the integrated circuit can be saved without sacrificing significant performance.

If the reversal buffer is viewed as a circular queue, or ring buffer, rather than a set of stacks much less memory will be needed. Instead of keeping a pointer at the top of each stack, a pair of pointers can be kept to locate the start and end of each string in the queue, called the head and tail pointers respectively. When a string to be reversed is written to the string reversal mechanism 6, the next available pair of pointers will be set to the next available location in the string queue 9. When the end of a string is received, the head and tail pointers are saved and a new pair of pointers will be assigned to the next byte in the queue. To reverse the string, the byte addressed by the head pointer will be output and the head pointer decremented until the tail pointer is reached and the last byte of the string is output. Once this entire string has been output the pair of pointers is now available to be used for another string.

The size of the circular queue required to implement this circular stack is substantially less than the amount of memory required to implement the multiple-stack technique. The most demanding condition that may be produced by the decompressor 2 will be a string of maximum length followed by a number of single-byte strings equal to the length of the maximum string. Since the maximum length of a string has been limited to 128 bytes, the string queue 9 must be able to hold 256 bytes to accommodate this most demanding case without forcing the decompressor to wait while a string is being popped off.

The head and tail pointers for each string can also be stored in a circular queue, the pointer queue 10. Since the string queue 9 is 256 bytes long, each pointer used to designate a location within it must be eight bits long. The string queue will then need to be 256 bytes long, to store the 128 pairs of pointers that may represent strings stored in the string queue. Two pairs of eight-bit registers are also required for the insertion 13,14 and removal 11,12 pointers, and two seven-bit registers are required to be used for the head 16 and tail 15 pointers for the pointer queue. The head and tail pointers for the string queue are used to keep track of the addresses in the pointer queue where pairs of pointers are stored. The present invention utilizes two dual-ported random-access memories (RAM) 7,8 as circular queues to store the strings and the pointers as shown in FIG. 2. The first dual-ported RAM 7 is used to store the strings of symbols to be reversed and the second dual-ported RAM 8 is used to store the addresses of the first and last symbols of each string within the first queue 9. The use of dual-ported RAMs allows entries to be added to and removed from each queue simultaneously.

As a string is output from the decompressor 2 each character is stored in the string queue 9 and its beginning and ending addresses are stored in the pointer queue 10. When all the characters of a string have been pushed onto the string queue, they are then popped off in reverse order and output from the string reversal mechanism 6. The string queue has the capability of holding multiple strings at one time so that as one string is getting pushed onto the string queue another string can be popped off of the string queue. The ability to concurrently input and output is implemented by the two dual-ported random-access memories 7,8.

The second circular queue is called the pointer queue 10 because it stores the beginning and ending addresses of each string that is stored in the string queue 9. As characters are output from the decompressor 2 they are written into the string queue, which will provide sufficient space to hold two strings of the maximum length that can be produced, or 256 total characters. When the first symbol of a string is written to the string queue, the address to which it was written is stored as the head pointer for that string in the pointer queue. When the last symbol of a string is written to the string queue, the address to which it was written is stored as the tail pointer for that string. This pair of addresses is then used to locate the string within the string queue and their use essentially creates a set of "virtual stacks" within the string queue.

The string reversal mechanism 6 also includes the logic necessary to control the insertion of symbols into the string queue 9 and the removal of symbols from the string queue. These two control elements work independently and concurrently to allow a string to be pushed onto the string queue as another string is being popped off of the string queue. The insertion control logic is responsible for writing symbols into the string queue and accumulating the start and end pointers for the current string. Upon completion of a string, the insertion control logic writes the start and end pointers into the pointer queue 10, updates the insertion pointer for that queue, and starts a new string.

The removal control logic reads symbols from the string queue 9 and outputs them using the start and end pointers for each string. To reverse the data, the symbols are removed from the end pointer to the start pointer, in the opposite direction from the order that they were inserted. Upon completion of a string, the start and end pointers for the next string are loaded and the removal pointer is updated for that queue.

The size of the pointer queue 10 can be cut in half by storing one pointer between strings instead of two. Since the end of one string in the buffer corresponds with the beginning of the next string, it is not necessary to store both the start and ending pointers for each string in the pointer queue. A single pointer can be stored between strings and used as the end of one string and the beginning of the next string. By only using one pointer as both the end of one string and the start of the next string, the dual-ported RAM 8 necessary for the pointer queue can be reduced by half, but in order to do this, the complexity of the insertion and removal logic must be increased.

This single clock cycle data compressor/decompressor with a string reversal mechanism can compress data adaptively, decompress previously compressed data, and reverse the characters within a string of data that has been decompressed in order to restore the data to its original format. The compressor can compress data at the rate of 1 character per clock cycle. A content addressable memory is used to facilitate faster compression. The content addressable memory has the ability to perform a write and a search function during the same clock cycle. Strings of characters are encoded and stored in a string table. The input data is then matched to strings already stored in the string table. The string table is built as the data is input and the contents of the string table is completely dependent on the data that is to be compressed. Each string stored within the string table represents a multiple number of characters and is stored as the location within the string table of the longest matching string seen in the previous input and the one character that makes this string different than all the rest of the strings stored in the string table.

During decompression, the codes for the strings are output to the decompressor and the one character that makes each string different is separated and output. The extension character stored at the address of the longest matching string seen thus far is then separated and output, until all of the characters in the string have been output. During decompression the characters within each string are output in reverse of the order in which they were originally input. The string reversal mechanism is used to reverse the order of the characters within a string and output them in their correct order.

The string reversal mechanism has the capability to output one string in reverse order as it is inputting another string from the decompressor thus speeding up decompression. Two dual-ported random-access memories are used in the string reversal mechanism each have the capability of inputting and outputting at the same time. The first dual-ported random-access memory is used to store the strings to be reversed, one character at a time. The second dual-ported random-access memory is used to store the beginning and ending addresses of each string that is stored in the first dual-ported random-access memory.

This single clock cycle data compressor/decompressor with a string reversal mechanism can reduce the size of a block of data to be stored or transmitted without reducing the amount of information stored in the block of data. The decompressor and the string reversal mechanism then can convert the compressed data that was stored or transmitted back into its original format.

We claim:

1. A single clock cycle data compressor comprising:
   a. means for receiving data from an input source; and
   b. means for simultaneously storing the received data, either in its original form or in a compressed form and concurrently comparing subsequently received data to stored data to determine if the subsequently received data matches the stored data.

2. The single clock cycle data compressor as claimed in claim 1 wherein the means for simultaneously storing and comparing further comprises a content addressable memory having means for writing, searching, and reading.

3. The single clock cycle data compressor as claimed in claim 2 wherein the content addressable memory is dynamic, requiring periodic refreshing.

4. The single clock cycle data compressor as claimed in claim 2 wherein the means for storing further comprises a string table to store a plurality of strings each string representing the compressed form of one of the received data, said string table stored in the content addressable memory.

5. The single clock cycle data compressor as claimed in claim 4 wherein each string representing a compressed form of input data comprises twenty bits, twelve of which represent the address of a longest matching string and eight of which represent a last symbol of the string that makes this string different from each other string stored in the string table.

6. The single clock cycle data compressor as claimed in claim 5 wherein the string table is limited to 4088 entries and the maximum string length is 128 symbols.

7. The single clock cycle data compressor as claimed in claim 6 wherein the first 256 strings stored in the string table each represent a single symbol having the compressed form for each symbol comprising the ASCII representation for that symbol followed by a null prefix.

8. The single clock cycle data compressor as claimed in claim 7 wherein the first 256 strings stored in the string table are hard-wired in the content addressable memory.

9. The single clock cycle data compressor as claimed in claim 6 wherein the first 256 strings are not stored but utilize an ASCII representation for that symbol followed by a null prefix.

10. A single clock cycle adaptive data compressor comprising:
    a. means for receiving data from an input source;
    b. means for simultaneously storing data wherein said means is configured to store data received from the input source either in its original form or in a compressed form and concurrently comparing subsequently received data to each one of a plurality of stored data to determine if the subsequently received data matches any one of the stored data; and
    c. means for generating a signal when the received data matches a stored data.

11. The single clock cycle adaptive data compressor as claimed in claim 10 wherein the means for comparing and the means for storing are performed by a content addressable memory having means for writing, searching, and reading.

12. The single clock cycle adaptive data compressor as claimed in claim 11 wherein the content addressable memory has the capacity to store 4088 compressed forms where each compressed form includes twenty bits, eight which represent a last byte of the received data and twelve which represent the location in the memory where the remainder of the received data is stored.

13. The single clock cycle data compressor as claimed in claim 12 further comprising:
    a. means for receiving data from an input source a byte at a time, each byte representing eight bits of information;
    b. means for parsing the bytes into strings, where each string consists of a longest matching string relative to each previous input plus a single byte that makes it different from each prior string forming a new string thereby;
    c. means for adding the new string to a table where the new string is compressed into a coded form comprising an address in the table of the longest matching string plus the last byte of the string that makes this string different from any other string;
    d. means for storing the coded form for each string input, while simultaneously, comparing subsequent strings to strings stored in the table to determine if the subsequent string matches any of the stored strings; and
    e. means for generating a signal if the subsequent string does match a string stored in the table.

14. The single clock cycle data compressor as claimed in claim 13 wherein the first 256 strings stored in the table each represent a single symbol with the coded form for each symbol comprising the ASCII representation for the symbol followed by a null prefix.

15. The single clock cycle data compressor as claimed in claim 14 wherein the first 256 strings stored in the table are hard-wired in the content addressable memory.

16. The single clock cycle data compressor as claimed in claim 13 wherein the first 256 strings are not stored but utilize an ASCII representation for that symbol followed by a null prefix.

17. A single clock cycle data compressor comprising:
    a. a memory consisting of a plurality of memory cells grouped together to form a plurality of strings wherein each string contains a plurality of bytes of information, each byte containing eight bits, said memory having the capacity to store 4096 strings;
    b. a control logic module coupled to control the memory;
    c. a data bus, Stringdata, consisting of a plurality of data lines, each data line capable of carrying one bit of information, coupled to the memory and the control logic module;
    d. an address bus, Address, consisting of a plurality of address lines, each address line capable of carrying one bit of information, coupled to the memory and the control logic module;
    e. means for preconditioning each line of the data bus and each line of the address bus to a predetermined logic state voltage;
    f. means for storing the value of Stringdata at a location represented by the value of Address;
    g. means for comparing the value of Stringdata to all stored Strings to determine if Stringdata matches any of the stored Strings, wherein said means for storing and said means for comparing are performed concurrently within the same clock cycle;

h. a match line for signalling if Stringdata matched any of the stored Strings wherein said match line will be at a first voltage level if Stringdata did match a string or at a second voltage level if Stringdata did not match any of the stored strings; and i. means for incrementing Address if the match line is at a low potential.

18. The single clock cycle data compressor as claimed in claim 17 wherein the memory is a content addressable memory comprising the means for storing and the means for comparing and further having means for writing, searching, and reading.

19. The single clock cycle data compressor as claimed in claim 18 wherein the first 256 Strings stored in the memory are root codewords which each represent a single symbol and each consist of the ASCII representation of the symbol followed by a null prefix and further wherein the first 256 strings are permanently hard-wired in the content addressable memory.

20. A string reversal mechanism comprising:

a. means for receiving data from an input source in strings of characters;

b. means for storing the string of characters; and c. means for simultaneously storing subsequent strings of characters while outputting previously stored strings of characters in reverse of the order in which they were stored.

21. The string reversal mechanism as claimed in claim 20 wherein the means for reversing the strings of characters as stored and the means for simultaneously storing the received data and outputting the reversed data are each performed by a dual-port random access memory, a first dual-port random-access memory for storing and outputting the strings of characters and a second dual-port random-access memory for storing a beginning and an ending address for each string stored in the first dual-port random-access memory.

22. The string reversal mechanism as claimed in claim 21 wherein the beginning and ending address of each string can be replaced by storing a single address between each string representing both the ending address of a first string and the beginning address of a second string.

23. A string reversal mechanism comprising:

a. means for receiving data from an input source in a string, each string comprising a plurality of bytes, each byte containing eight bits of information;

b. means for storing each byte as a part of a string in the order that it is received from the input source; and c. means for outputting each byte of a string in reverse of the order in which the bytes were received, wherein said means for outputting and said means for storing can be accomplished simultaneously.

24. The string reversal mechanism as claimed in claim 23 wherein the means for simultaneously storing the received data and outputting the reversed data are each performed by a dual-port random access memory, with a first dual-port random-access memory for storing and outputting the strings of characters and a second dual-port random access memory for storing a beginning and an ending address for each string stored in the first dual-port random-access memory.

25. The string reversal mechanism as claimed in claim 24 wherein the beginning and ending address of each string can be replaced by storing a single address between each string representing both the ending address of a first string and the beginning address of a second string.

26. A method of reversing strings of characters comprising the steps of:

a. receiving data from an input source in strings of characters;

b. storing a string of characters one character at a time; and c. simultaneously storing subsequent strings of characters one character at a time and outputting previously stored strings of characters, in reverse of the order in which they were stored, one character at a time.

27. The method of reversing data as claimed in claim 26 wherein the step of simultaneously storing and outputting are performed by two dual-port random-access memories, the first dual-port random-access memory performing the storing and outputting functions and the second dual-port random-access memory storing a beginning and ending address for each string stored in the first dual-port random-access memory.

28. The method of reversing data as claimed in claim 27 wherein the beginning and ending address of each string can be replaced by storing a single address between strings, said single address representing both the ending address of a first string and the beginning address of a second string.

29. A string reversal mechanism comprising:

a. a data bus, Stackdata, capable of carrying a byte of information at a time, each byte containing eight bits, said data bus for receiving data from an input source in a string of bytes;

b. a first dual-port random-access memory coupled to the data bus, containing a string queue for storing strings one byte at a time, in the order that they are received from the input source;

c. a second dual-port random-access memory coupled to the first dual-port random-access memory, containing a pointer queue for storing a head pointer and a tail pointer for each string stored in the first dual-port random-access memory;

d. an output data bus, OutputByte, capable of outputting a byte of information at a time, each byte containing eight bits, wherein a string is output one byte at a time in reverse of the order in which it was input simultaneously as a string is input one byte at a time to the first dual-port random-access memory;

e. a tail removal pointer register for storing the end of the string that is currently being reversed and output from the string reversal mechanism;

f. a head removal pointer register for storing the beginning of the string that is currently being reversed and output from the string reversal mechanism;

g. a tail insertion pointer register for storing the end of the string that is currently being input into the string reversal mechanism;

h. a head insertion pointer register for storing the beginning of the string that is currently being input into the string reversal mechanism;

i. a pointer queue tail register for storing the last address within the pointer queue where pairs of pointers are stored; and j. a pointer queue head register for storing the first address within the pointer queue where pairs of pointers are stored.

30. The string reversal mechanism as claimed in claim 29 wherein the head and tail pointer for each string can be replaced by storing a single pointer located between each pair of strings, said single pointer representing both the ending address of a first string and the beginning address of a second string.

31. A single clock cycle data compressor/decompressor with a string reversal mechanism comprising:
   a. means for receiving data from an input source;
   b. means for simultaneously storing the received data either in its original form or in a compressed form and concurrently comparing subsequently received data to stored data to determine if the subsequently received data matches the stored data; and
   c. means for subsequently retrieving the stored data in its compressed form and restoring it to its original form.

32. The single clock cycle data compressor/decompressor with a string reversal mechanism as claimed in claim 31 wherein the means for comparing and the means for storing are performed by a content addressable memory which has the capability to perform write, search, and read operations.

33. The single clock cycle data compressor/decompressor with a string reversal mechanism as claimed in claim 32 wherein the content addressable memory is dynamic and requires periodic refreshing, said refreshing comprising the steps of:
   a. placing the address of a row at a time on an address bus; and
   b. asserting a refresh signal.

34. The single clock cycle data compressor/decompressor with a string reversal mechanism as claimed in claim 33 wherein the means for storing further comprises a string table to store strings representing the compressed form of the received data, said string table stored in the content addressable memory.

35. The single clock cycle data compressor/decompressor with a string reversal mechanism as claimed in claim 34 wherein each string representing a compressed form of input data comprises twenty bits, where twelve bits represent the address of a longest matching string and eight bits represent a last character of the string that makes this string different from the other strings stored in the string table.

36. The single clock cycle data compressor/decompressor with a string reversal mechanism as claimed in claim 35 wherein the string table is limited to 4088 entries and the maximum string length is limited to 128 symbols.

37. The single clock cycle data compressor/decompressor with a string reversal mechanism as claimed in claim 36 wherein the first 256 strings are not stored but utilize an ASCII representation for that symbol followed by a null prefix.

38. The single clock cycle data compressor/decompressor with a string reversal mechanism as claimed in claim 37 wherein the means for retrieving stored data comprises a decompressor module and a string reversal mechanism said decompressor outputting strings of characters to said string reversal mechanism.

39. The single clock cycle data compressor/decompressor with a string reversal mechanism as claimed in claim 38 wherein the string reversal mechanism comprises:
   a. means for receiving strings of characters from the decompressor module;
   b. means for storing a string of characters; and
   c. means for simultaneously storing subsequent strings of characters while outputting previously stored strings of characters in reverse of the order in which they were stored.

40. The single clock cycle data compressor/decompressor with a string reversal mechanism as claimed in claim 39 further comprising:
   a. means for receiving data from an input source a byte at a time, each byte representing eight bits of information;
   b. means for parsing the bytes into strings, where each string consists of the longest matching string seen thus far in the previous input plus the one byte that makes it different from prior strings;
   c. means for adding the string to a table where the string is compressed into a coded form and represented as an address in the table of the location of the longest matching string plus the last byte that makes this string different from any other string; and
   d. means for storing the coded form for each string.

41. The single clock cycle data compressor/decompressor with a string reversal mechanism as claimed in claim 40 having a decompressor which comprises:
   a. means for separating a string into a prefix and an extension character;
   b. means for outputting the extension character to the string reversal mechanism;
   c. means for moving to the location in the memory as represented by the prefix separating the string stored at that location into its prefix and extension character, and outputting the extension character to the string reversal mechanism; and
   d. means for repeating the last step until a null prefix is reached.

42. A single clock cycle data compressor/decompressor with a string reversal mechanism comprising:
   a. a data bus, Stringdata, consisting of a plurality of data lines, each capable of carrying a bit of information;
   b. an address bus, Address, consisting of a plurality of address lines, each capable of carrying a bit of information;
   c. means for preconditioning each line of the input data bus and each line of the address bus to a predetermined logic state voltage;
   d. means for coupling each preconditioned line of the data bus and each preconditioned line of the address bus to a memory forming a stored memory state voltage at the location represented by the value of Address;
   e. means for comparing the preconditioned Stringdata line voltages to all stored memory states, to determine if the Stringdata line voltages collectively match any of the stored memory states wherein said means for coupling and said means for comparing can be performed within the same clock cycle;
   f. means for generating a signal if the Stringdata line voltages do collectively match any of the stored memory states;
   g. means for incrementing the value represented by the address bus if the data line voltages collectively do not match any of the stored memory states;
   h. means for subsequently retrieving the preconditioned data line voltages and separating them into a prefix and an extension character;
   i. means for outputting the extension character to a string reversal mechanism;
   j. means for storing the extension character as part of a string;
   k. means for locating the data value represented by the prefix and separating it into its prefix and extension character;
   l. means for outputting the extension character to a string reversal mechanism, storing it as part of a string and continuing to separate each prefix into its prefix and extension character until the null prefix is reached; and m. means for outputting from the string reversal mechanism each character of a string in reverse of the order in which the characters were received, wherein said means for outputting and said means for storing the extension character can be accomplished simultaneously.

43. The single clock cycle data compressor/decompressor with a string reversal mechanism as claimed in claim 42 wherein the memory is a content addressable memory having means for reading, writing, and searching.

44. The single clock cycle data compressor/decompressor with a string reversal mechanism as claimed in claim 43 wherein the first 256 strings stored in the table each represent a single symbol with the coded form for each symbol comprising the ASCII representation for the symbol followed by a null prefix.

45. The single clock cycle data compressor/decompressor with a string reversal mechanism as claimed in claim 44 wherein the first 256 strings stored in the table are hard-wired in the content addressable memory.

46. The single clock cycle data compressor/decompressor with a string reversal mechanism as claimed in claim 43 wherein the first 256 strings are not stored but utilize an ASCII representation for that symbol followed by a null prefix.

47. A single clock cycle data compressor/decompressor with a string reversal mechanism comprising:

a. a first memory consisting of a plurality of memory cells grouped together to form a plurality of strings wherein each string contains a plurality of bytes of information, each byte containing eight bits, said first memory having the capacity to store 4096 strings;

b. a control logic module;

c. a data bus consisting of a plurality of data lines, each data line capable of carrying one bit of information, coupled to the first memory and the control logic module;

d. an address bus consisting of a plurality of address lines, each address line capable of carrying one bit of information, coupled to the first memory and the control logic module;

e. means for preconditioning each line of the input data bus and each line of the input address bus to a predetermined logic state voltage;

f. means for storing the value represented by the data lines at a location represented by the value of the address lines;

g. means for comparing the value of the data lines to all stored strings, wherein said means for storing and said means for comparing can be performed within the same clock cycle;

h. means for generating a signal if the data lines matched any of the stored strings;

i. means for incrementing the value represented by the address bus if the data lines did not match any of the stored strings;

j. means for subsequently retrieving a stored value and separating it into a prefix and an extension character;

k. means for outputting the extension character to a string reversal mechanism to be stored by said string reversal mechanism as part of the string;

l. means for separating the prefix into its prefix and its extension character and storing the extension character in the string reversal mechanism;

m. means for separating each subsequent prefix into its prefix and extension character and outputting each extension character until a null prefix is reached, said null prefix representing the end of a string;

n. means for retrieving the next stored value, separating it into its prefix and extension character, outputting the extension character, separating each subsequent prefix into its prefix and extension character, and outputting each extension character until the null prefix is reached; and o. means for outputting from the string reversal mechanism each character of a string, in reverse of the order in which the characters were received, wherein said string reversal mechanism comprises a second memory and a third memory for storing the characters of a string before they are output in reverse order, said second memory having the capability to store numerous strings.

48. The single clock cycle data compressor/decompressor with a string reversal mechanism as claimed in claim 47 wherein the second memory is comprised of a dual-port random-access memory having means for storing and outputting the strings of characters in reverse order.

49. The single clock cycle data compressor/decompressor with a string reversal mechanism as claimed in claim 48 wherein the third memory is comprised of a dual-port random-access memory having means for storing a beginning and an ending address for each string stored in the second memory.

* * * * *

UNITED STATES PATENT AND TRADEMARK OFFICE
CERTIFICATE OF CORRECTION

PATENT NO.    : 5,818,873

DATED         : October 6, 1998

INVENTOR(S)   : Wall et al.

It is certified that error appears in the above-identified patent and that said Letters Patent is hereby correct as shown below:

In Column 9, line 60, delete "Incode" and insert --InCode--.

Signed and Sealed this

Ninth Day of February, 1999

Attest:

*Attesting Officer*

*Acting Commissioner of Patents and Trademarks*